United States Patent
Omoto (10) Patent No.: US 6,982,522 B2
(45) Date of Patent: Jan. 3, 2006

(54) LED DEVICE INCLUDING PHOSPHOR LAYERS ON THE REFLECTING SURFACE

(75) Inventor: Masatoshi Omoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 61 days.

(21) Appl. No.: 10/667,669

(22) Filed: Sep. 23, 2003

(65) Prior Publication Data

US 2004/0066140 A1    Apr. 8, 2004

(30) Foreign Application Priority Data

Oct. 7, 2002   (JP) .............................. 2002-293693

(51) Int. Cl.
    *H01L 33/00* (2006.01)
(52) U.S. Cl. .................... 313/502; 313/498; 313/512; 257/98
(58) Field of Classification Search ................ 313/498, 313/500–503; 257/98
    See application file for complete search history.

(56) References Cited

U.S. PATENT DOCUMENTS

| 5,593,782 A | * | 1/1997 | Budd .......................... 428/403 |
| 5,813,753 A | * | 9/1998 | Vriens et al. ................ 362/293 |
| 2002/0021085 A1 | * | 2/2002 | Ng .............................. 313/499 |
| 2003/0201451 A1 | * | 10/2003 | Suehiro et al. ............... 257/98 |

FOREIGN PATENT DOCUMENTS

| JP | 11-31845 | 2/1999 |
| JP | 11-40858 | 2/1999 |
| JP | 11-46015 | 2/1999 |
| JP | 2000-223750 | 8/2000 |

OTHER PUBLICATIONS

First Office Action in Chinese Patent Application No. 03143490.8 dated Feb. 18, 2005.

* cited by examiner

*Primary Examiner*—Karabi Guharay
(74) *Attorney, Agent, or Firm*—Morrison & Foerster LLP (57) ABSTRACT

The present invention provides an LED device 1 as a light source having an excellent color reproducibility and high luminance. The LED device 1 comprises: a base 2 having a recess 4 with the upper surface opened, the inner wall surface of the recess 4 constituting a reflection surface 4a; a LED chip 5 disposed on the inner bottom of the recess 4; a resin 10 filled in the recess 4, the resin 10 including phosphors 7a, 7b, 7c which absorb a part of light emitted from the LED chip to convert the wavelength thereof and emit light; and a phosphor layer 6a, 6b, 6c formed on the reflection surface 4a, the phosphor layer 6a, 6b, 6c including the phosphors 7a, 7b, 7c.

16 Claims, 8 Drawing Sheets

PRIOR ART

Fig. 15

LED DEVICE INCLUDING PHOSPHOR LAYERS ON THE REFLECTING SURFACE

BACKGROUND OF THE INVENTION

The present invention relates to an LED device used mainly for backlight of liquid crystal display of personal digital assistant and so on and for all kinds of indicators. Particularly, the LED device has phosphors that are excited by light emitted from an LED to emit light of different wavelength from the light emitted from the LED and is used for an LED light source emitting white or neutral light.

Figure 14:
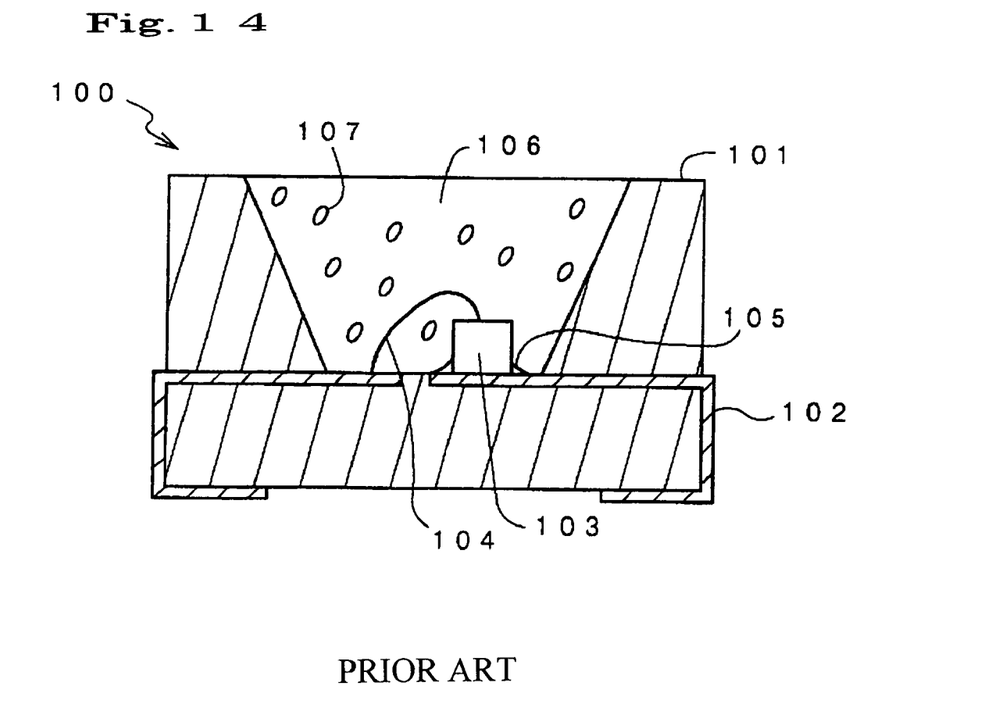
FIG. 14 is a sectional view of a conventional LED device.
Figure 15:
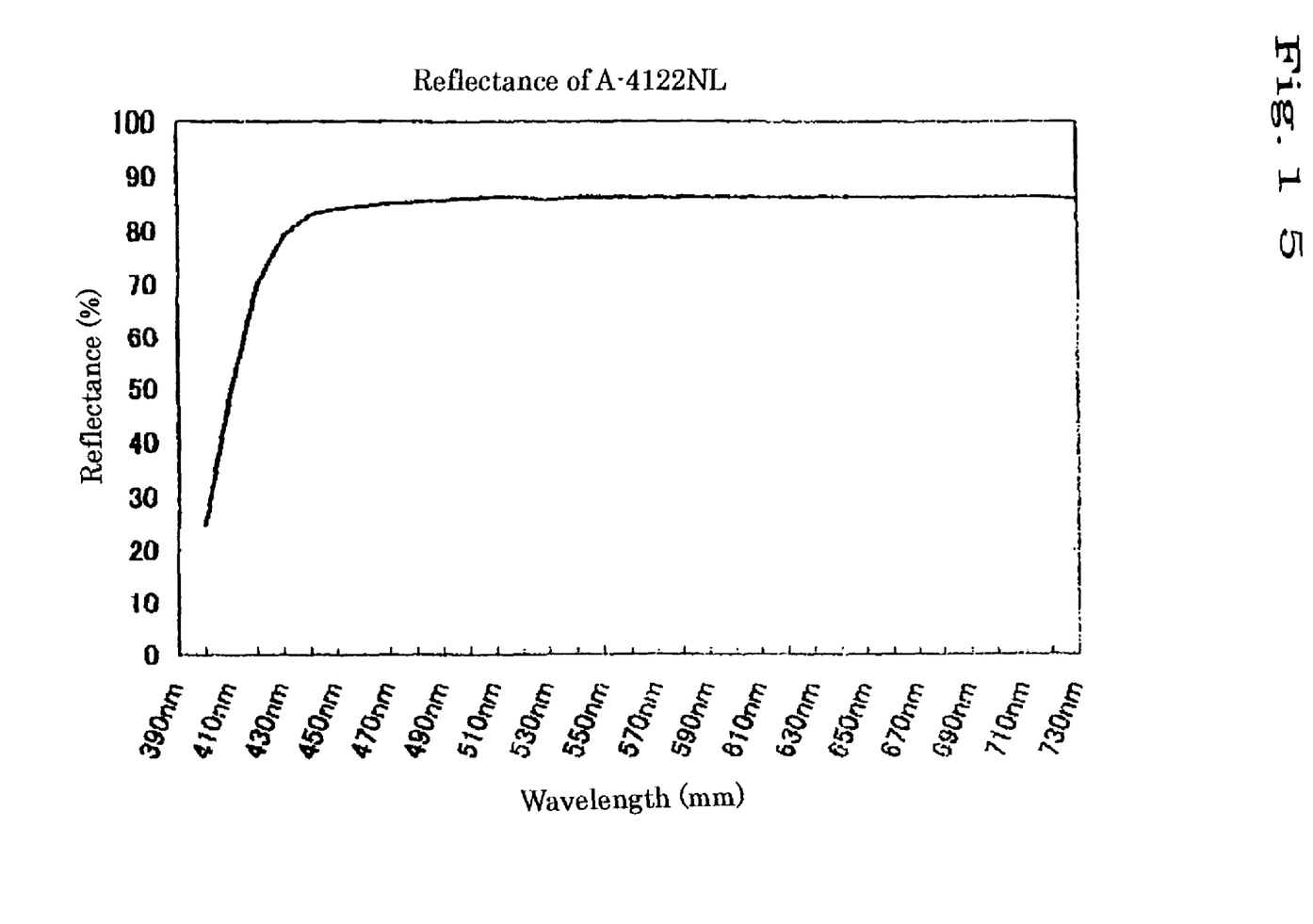
FIG. 15 is a graph showing reflectance of AMODEL® A-4122NL used for the base.

Recently, demand for cellular phone and so on using color LCD has been expanded. As a backlight source of the color LCD, a white LED device has been used. A white LED device 100 as shown in FIG. 14 is provided with a base 101 made of white-light reflecting resin, i.e., AMODEL®, VECTRA® and so on and metal frames 102. On the inside bottom of a mortar-like or cone-like portion of the base 101 and on the metal frame 102, an LED chip (light emitting diode) 103 is mounted. The LED chip 103 is a blue LED emitting light having a wavelength of around 460 nm. Conduction of the LED chip 103 is made through an Au wire 104 and conductive adhesive 105. According to the structure of the LED chip 103, the conduction may be accomplished through the Au—Au connection by a facedown method and also may be made through two Au wires. The LED chip 103 is fixed by a transmission type of resin 106 such as epoxy resin, silicon resin and so on.

In order to obtain predetermined light tone and chromaticity coordinate, the resin 106 includes YAG phosphors 107 which emit light of different wavelength from the wavelength of light emitted from the LED chip 103, i.e., which absorb a part of the light emitted from the LED chip 103 and convert the wavelength of it to emit light. As described above, in the generally used white LED device 100, a pseudo-white light emission is made by a combination of the blue LED chip 103 and the YAG phosphors 107. That is, the pseudo-white light emission is accomplished through a color mixture emission by a combination of or a complementary color of a blue light emitted from the blue LED chip 103 and a yellow light emitted from the excited YAG phosphors 107 (for example, refer to Japanese Laid-open patent publication No. 2000-223750, FIG. 2).

However, the pseudo-white light is not obtained by a color mixture of three primary colors, i.e., red, green and blue, resulting in a disadvantage of less reproducibility of especially red. Thus, a white LED device (not shown) of good color quality which is a combination of a blue LED 103 and phosphors emitting red, blue and green lights can be devised. As the phosphors emitting red, blue and green lights have a low excitation efficiency or a low wavelength-conversion efficiency, luminance of the white LED device is low, resulting in a disadvantage of being off from practical use.

Figure 10:
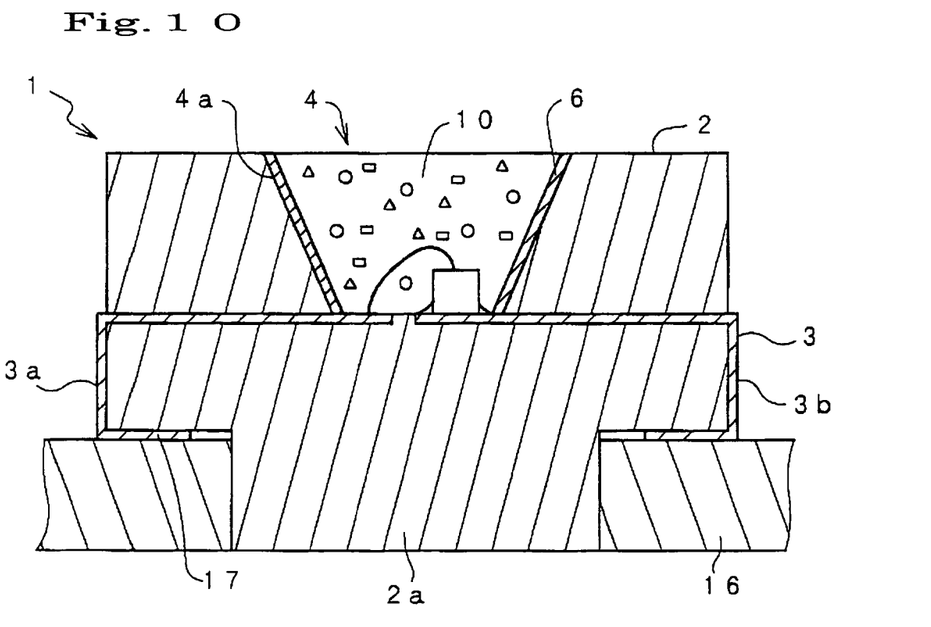
FIG. 10 is a sectional view of a variation of the LED device of FIG. 1.

In order to solve the above problems, in stead of the blue LED 103 emitting light having a blue-region wavelength of 460 nm, it can be devised to use an LED emitting light having a short blue-violet-region wavelength of 430 nm or below to improve the excitation efficiency of the phosphors. However, when the wavelength of the emitting light is changed to an ultraviolet region from the blue-violet-region wavelength of 430 nm or below, even the high-efficiency light-reflecting resin (AMODEL®, VECTRA® and so on) used as the base 101 of the LED device 100 of the visible light region has a rapidly reduced light reflectance in a short wavelength region. Thus, the reflection on the base 101 (the reflection on the mortar-like inner wall surface of the base 101) can not be conducted, causing a reduction of luminance of LED device 100. FIG. 10 shows reflectance of AMODEL® A-4122NL used for the base 101.

SUMMARY OF THE INVENTION

Thus, it is an object of the present invention to provide an LED device as a light source having excellent color reproducibility and high luminance.

In order to attain the above object, the present invention provide a LED device, comprising:
  a base having a recess with the upper surface opened, the inner wall surface of the recess constituting a reflection surface;
  a LED chip disposed on the inner bottom of the recess;
  a resin filled in the recess, the resin including phosphors which absorb a part of light emitted from the LED chip to convert the wavelength thereof and emit light; and
  a phosphor layer formed on the reflection surface, the phosphor layer including the phosphors.

According to the present invention, when the emitted light from the LED chip reaches the phosphor layer, the phosphors included in the phosphor layer convert the wavelength of the emitted light from the LED chip and emit light. Thus, the emitted light can be effectively converted, enhancing reflection efficiency and luminance.

The emitting wavelength of the LED chip is preferably 430 nm or below. Using such a light emitting source of blue-violet region, it is possible to effectively excite the phosphors which emit three primary colors, i.e., red, green and blue and which has a low conversion efficiency by the light of wavelength of blue region.

The phosphor layer preferably comprises a plurality of phosphor layers each of which is excited to emit a different wavelength of light from each other. In an embodiment, the phosphor layer comprises three layers each of which is excited by the light from the LED chip to emit light of red, green and blue, respectively. Thus, the light intensity of the LED device is remarkably enhanced, enabling to produce an LED device of high color rendering properties including red, green and blue.

In this case, the plurality of phosphor layers is preferably so arranged that the phosphor layer closer to the outside emits the shorter wavelength of light. In an embodiment, the phosphor layers are disposed to be excited by the light from the LED chip to emit light in the order of red, green and blue toward the outside from the inside. Thus, the incident light to the phosphor layer is increased, causing improvement of light intensity.

The phosphor layer is preferably formed by a method selected from the group consisting of vacuum depositing, printing and ink-jet applying.

The phosphors are preferably enclosed by micro-capsules each comprising Si as a main component. Thus, transmission of the emitted light from the LED chip can be prevented and the efficiency of reflecting the emitted light can be enhanced.

The base is preferably made of glass or metal material. If the base consists of glass, it can be reduced that the light that has finally reached the inner wall surface of the recess is transmitted through the inner wall surface, while if the base consists of metal material, it can be eliminated that reflectance of the light on the inner wall surface (reflection surface) of the recess is reduced every wavelength of the light.

The phosphor layer is preferably overlaid on a metal plating applied on the reflection surface.

The metal plating is preferably applied by means of a composite plating method in which electrodeposition is conducted as the phosphors are dispersed in the plating liquid of the metal plating.

In order to attain the above object, the present invention also provide a LED device, comprising:

a base having a recess with the upper surface opened, the inner wall surface of the recess constituting a reflection surface;

a LED chip disposed on the inner bottom of the recess;

a resin filled in the recess, the resin including phosphors which absorb a part of light emitted from the LED chip to convert the wavelength thereof and emit light; and an ultraviolet rays reflecting material applied on the reflection surface.

Preferably, mirror surface particles each having a mirror surface are dispersed in the surface layer of the resin filled in the recess at the rate of 10% or below of the surface area. Thus, the light that has reached surface layer of the resin from the LED chip is reflected on the mirror surface particles, returned to the inside of the device again and converted by the phosphors in the resin. As a result, wavelength conversion efficiency of the light from the LED chip is enhanced.

Preferably, the LED device further comprises a reflection resin layer disposed on the opening of the recess separately from the resin, the reflection resin layer being formed on or glued to the resin, the reflection resin layer including mirror surface particles each having a mirror surface. Thus, the light that has reached the reflection resin layer is reflected on the mirror surface particles, returned to the inside of the device again and excite the phosphors in the resin. As a result, wavelength conversion efficiency of the light is enhanced.

Preferably, dyes are mixed in the resin. In a case that the LED chip is deteriorated after using the LED device for a long time, the dye is decolorized, allowing the transmittance of the resin to be improved. As a result, apparent decline of the luminance of the LED device can be prevented.

Preferably, the LED device is provided with an ultraviolet cut filter or ultraviolet reflection member for cutting ultraviolet light having a wavelength of 400 nm or below on the opening of the recess. Thus, the influence of the ultraviolet ray upon a user can be reduced.

Preferably, the LED device is provided with a phosphor thin layer including the phosphors on the opening of the recess, the surface of the phosphor thin layer being trimmed using a laser trimming method. Thus, a desired wavelength can be obtained in the LED device, which reduces the variation in the color tone of the lights emitted from the LED devices.

Preferably, a heat pipe may be disposed inside the base.

Preferably, the center portion of the bottom of the base is protruded below.

BRIEF DESCRIPTION OF THE DRAWINGS

Further objects and advantages of the present invention will become clear from the following description taken in conjunction with the preferred embodiments thereof with reference to the accompanying drawings, in which.

DETAILED DESCRIPTION OF THE PREFERRED EMBODIMENTS

Figure 1:
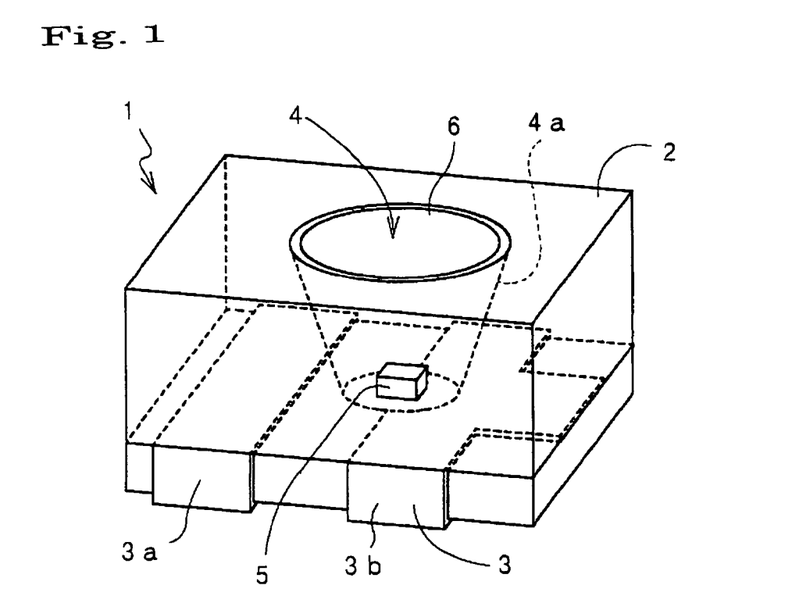
FIG. 1 is a perspective view of an LED device according to the present invention.
Figure 2:
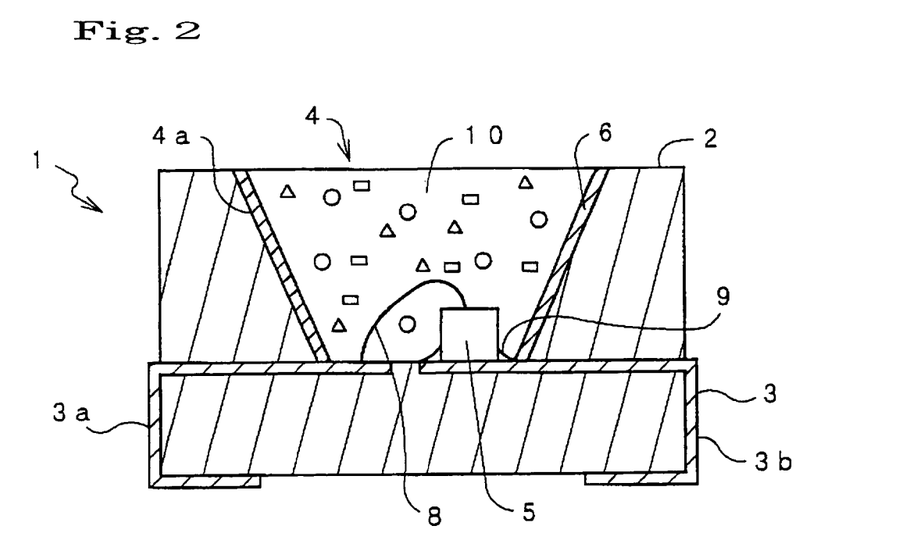
FIG. 2 is a sectional view of the LED device of FIG. 1.

FIG. 1 is a perspective view of an LED device 1 according to the present invention and FIG. 2 is a sectional view thereof. The LED device 1 is provided with a rectangular base 2 and metal frames 3 for electrical connection. The base 2 comprises resin material, for example, AMODEL®, VECTRA® and so on having a high reflection efficiency of visible light. In the middle portion of the base 2, a mortar-like or cone-like recess 4 with the upper surface opened is formed. On the inner bottom of the recess 4 and on the metal frame 3, an LED chip (light emitting diode) 5 is disposed. The inner wall surface (reflection surface) 4a of the mortar-like recess 4 is arranged to reflect light emitted from the LED chip 5 to prevent the base 2 from absorbing the emitted light. The metal frames 3 are disposed in the base 2 when insert molding the base 2 and comprises terminal electrodes 3a, 3b.

On the inner wall surface 4a of the recess 4, a phosphor layer 6 is formed. The phosphor layer 6 comprises a plurality of layers each for emitting a different wavelength of light, in particular comprises a three layer structure of a first layer 6a, a second layer 6b and a third layer 6c starting from the inside to the outside. The first layer 6a, the second layer 6b and the third layer 6c include phosphors 7a, 7b, 7c, respectively which convert the emitting wavelength of the LED chip 5 to red, green and blue (each absorbs a part of the emitting light from the LED chip 5 and converts the wavelength to emit light). In order to form the phosphor layer 6, a vacuum deposition or an application by an ink-jet application method may be conducted in the order of the third layer 6c, the second layer 6b and the first layer 6a. Alternatively, each layer may be embedded in the order of the third layer 6c, the second layer 6b and the first layer 6a and then unnecessary portions may be removed. A phosphor layer 6 molded beforehand to fit into the inner wall surface 4a of the mortar-like recess 4 may be glued to the inner wall surface 4a of the recess 4. In the present embodiment, although three kinds of phosphor layers 6a, 6b, 6c including phosphors 7a, 7b, 7c respectively are provided, only one phosphor layer 6 may be provided so that absorption of the emitted light from the LED chip 5 into the inner wall surface 4a of the recess 4 can be prevented.

The LED chip 5 is bonded to the terminal electrode 3a of the metal frame 3 through an Au wire 8 and electrically connected to the terminal electrode 3b through a conductive adhesive 9. The LED chip 5 is one that emits light ranging from blue violet to ultra violet and having a emitting wavelength of 430 nm or below when powered.

Inside the recess 4 and around the LED chip 5, a translucent resin 10, for example, epoxy resin, silicon resin, acrylic resin and so on is filled (sealed) so that fixation and protection of the LED chip 5 is attempted. In the translucent resin 10 are mixed the phosphors 7a, 7b, 7c.

Next, operation of the LED device 1 having the construction above will be described.

When conduction between the terminal electrodes 3a, 3b is permitted and the LED chip 5 emits light, the light emitted from the LED chip 5 passes through the translucent resin 10 and is emitted from the emitting surface of the LED device 1, i.e., the opening of the recess in the top surface. A part of the emitted light from the LED chip 5 is converted by the phosphors 7a, 7b, 7c mixed in the translucent resin 10 into longer wavelength side than that of the emitted light from the LED chip 5, in particular, red wavelength, green wavelength and blue wavelength which in turn are mixed to a desired chromaticity coordinate within the translucent resin 10 and then emitted from the emitting surface of the LED device 1. In this case, the wavelength of the emitted light from the LED chip 5 is 430 nm or below. Therefore, in comparison with the case that the phosphors 7a, 7b, 7c are excited by light having a wavelength of blue region, i.e., a wavelength of 460 nm, an excitation efficiency is enhanced and luminance and light intensity of the light emitted from the emitting surface of the LED device 1 are enhanced. Since the color mixture of three primary colors, i.e., red, green and blue is made, the white LED having a good color quality level can be obtained.

Figure 3:
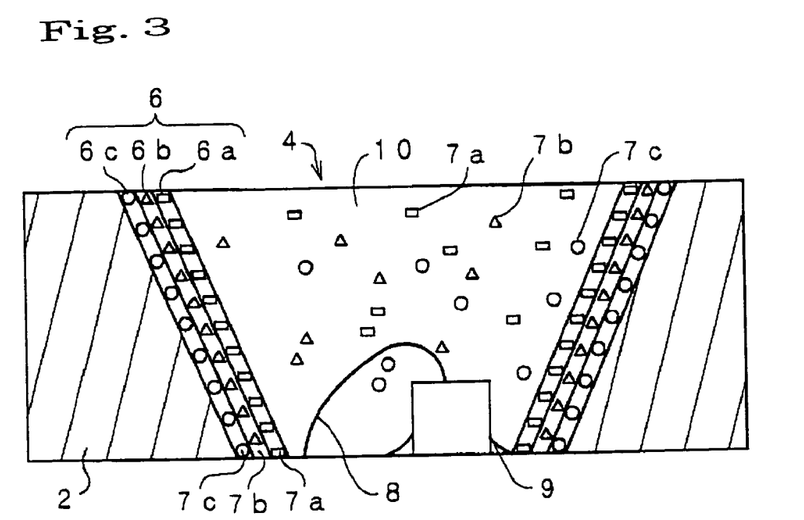
FIG. 3 is an enlarged sectional view of the LED device of FIG. 2.

A part of the emitted light from the LED chip 5 passes through the translucent resin 10 and reaches the phosphor layer 6 applied on the inner wall surface 4a. The emitted light from the LED chip 5 is converted by the phosphors 7a, 7b, 7c mixed in the translucent resin 10 into longer wavelengths than that of the emitted light from the LED chip 5. In particular, firstly, the emitted light of LED is converted by the phosphors 7a included in the first layer 6a of the phosphor layer 6 into red wavelength side. The remaining emitted light which has passed through the first layer 6a are then converted by the phosphors 7b included in the second layer 6b of the phosphor layer 6 into green wavelength side. Finally, the remaining emitted light which has passed through the second layer 6b are converted by the phosphors 7c included in the second layer 6b of the phosphor layer 6 into blue wavelength side. Thus, the emitted light reaches the first layer 6a, the second layer 6b and third layer 6c sequentially and is converted into lights having red, green, blue wavelengths in the respective layers. Since the phosphor layer 6 is disposed so that the phosphor layer closer to the outside emits the shorter wavelength of light, the emitted light can be effectively converted according to the difference of refraction index, improving the reflection efficiency. The incident light to each layer of the phosphor layer 6 is increased, causing improvement of a luminance and a light intensity of the light.

Light (of visible light region) that has been converted in the phosphor layer 6 and finally has reached the inner wall surface 4a or the reflective surface of the recess 4 is effectively reflected based on the reflection property of the resin constituting the base 2 to reach inside the translucent resin 10 or the emitting surface of the device 1. Thus, light that passes through the inner wall surface 4a can be significantly reduced. As described above, the quantity of light reaching the emitting surface of the device 1 is improved and the luminance and the light intensity of the light are also improved.

Figure 4:
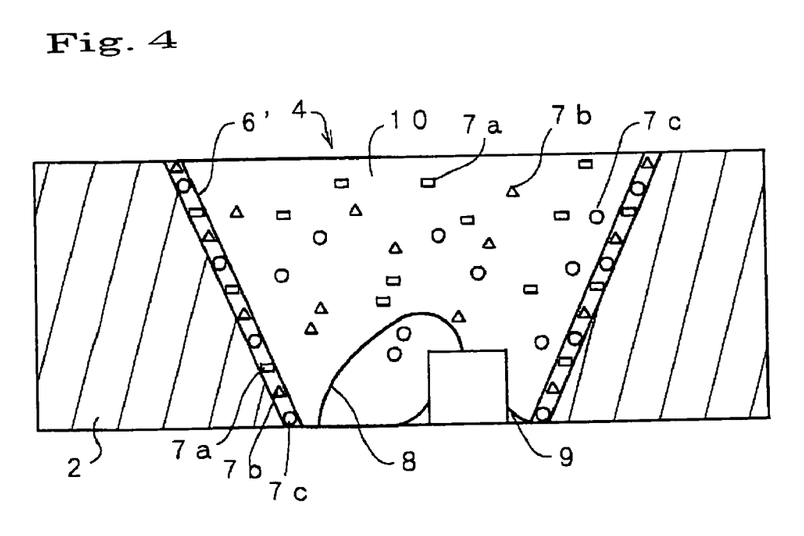
FIG. 4 is an enlarged sectional view of a variation of the LED device of FIG. 1

As a variation of the above embodiment, as shown in FIG. 4, a phosphor layer 6' including three kinds of phosphors 7a, 7b, 7c may be formed. In the phosphor layer 6', the phosphors 7a, 7b, 7c are disposed in order in a vertical direction. In such phosphor layer 6', the emitted light can be effectively converted, enhancing the reflection efficiency.

Figure 5:
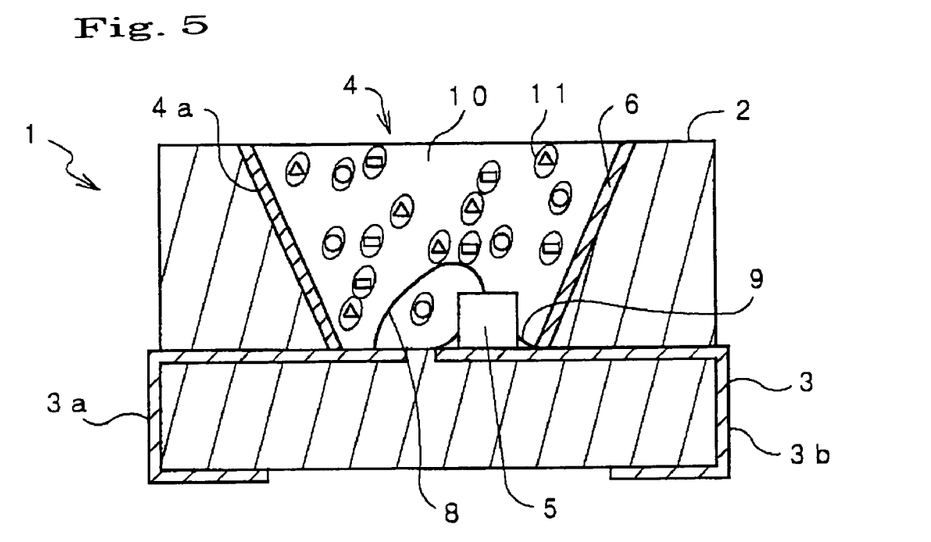
FIG. 5 is a sectional view of a variation of the LED device of FIG. 1.

As shown in FIG. 5, the phosphors 7a, 7b, 7c sealed together with the translucent resin 10 may be enclosed by micro-capsules each comprising Si as a main component, preventing transmission of the emitted light from the LED chip 5 and enhancing the reflection efficiency.

As an another variation of the above embodiment, the base 2 may be made not of resin material but of glass material. The glass material reduces that the light that has finally reached the inner wall surface 4a of the recess 4 is transmitted through the inner wall surface 4a. Alternatively, the base 2 may be made of metal material. In this case, it can be eliminated that reflectance of the light on the inner wall surface (reflection surface) 4a of the recess 4 is reduced every wavelength of the light.

As a still another variation, metal plating such as nickel plating, copper plating and so on can be applied on the inner wall surface (reflection surface) 4a of the recess 4. The metal plating can eliminate, in the same manner as the case described above, that reflectance of the light on the reflection surface is reduced every wavelength of the light. In this case, it is preferable to overlay the phosphor layer 6 after applying the metal plating on the reflection surface. The metal plating may be applied by means of a composite plating method in which electrodeposition is conducted as the phosphors 7a, 7b, 7c are dispersed in the plating liquid of the metal plating. The metal plating brings about simultaneous effects both of wavelength conversion due to excitation of the phosphors and reflection on the metal surface and simplifies production process.

Figure 6:
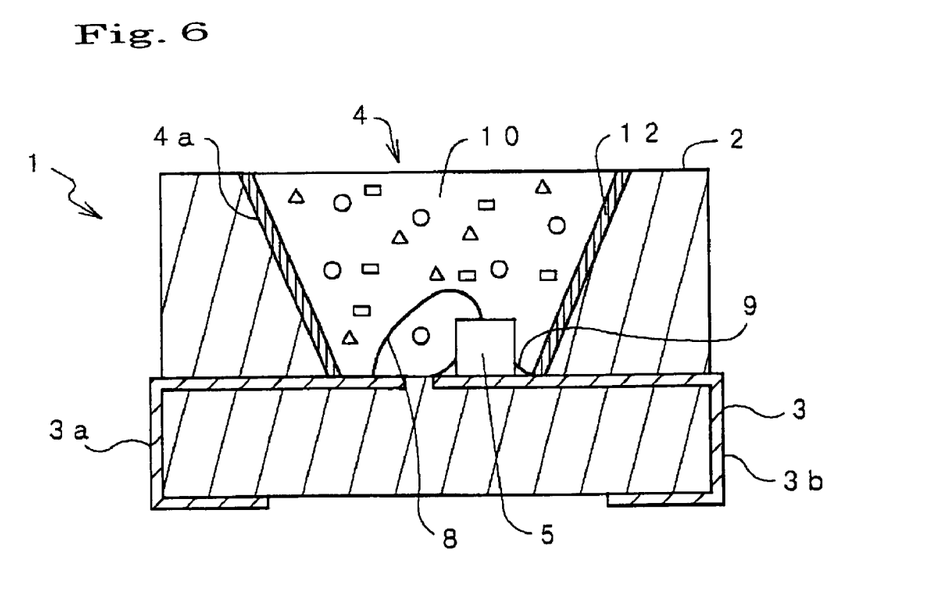
FIG. 6 is a sectional view of a variation of the LED device of FIG. 1.

As shown in FIG. 6, in stead of applying the phosphor layer 6 on the reflection surface, it is also possible to apply an ultraviolet rays reflecting material 12 such as titanium oxide for preventing light absorption on the inner wall surface 4a of the recess 4.

Figure 7:
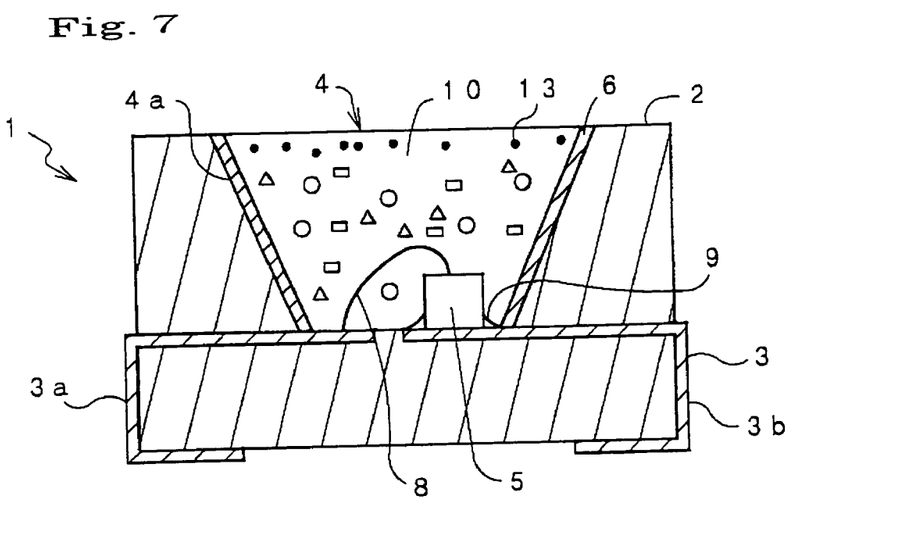
FIG. 7 is a sectional view of a variation of the LED device of FIG. 1.

In the translucent resin 10 molded in the mortar-like recess 4, mirror surface particles 13 each having a smaller specific gravity than that of the resin 10 and a mirror surface may be mixed at the rate of 1% or below of the translucent resin 10. In this case, as shown in FIG. 7, after the resin 10 is cured, the mirror surface particles 13 are dispersed in the surface layer of the resin 10 filled in the emitting surface or the recess 10 of the device 1 at the rate of 10% or below of the surface area. Thus, the light that has reached surface layer of the resin 10 from the LED chip 5 is reflected on the mirror surface particles 13, returned to the inside of the device 1 again and converted by the phosphors 7a, 7b, 7c in the translucent resin 10. As a result, incident efficiency to the phosphors 7a, 7b, 7c becomes high and wavelength conversion efficiency is enhanced, which improves light intensity and emitting efficiency of the LED device 1.

Figure 8:
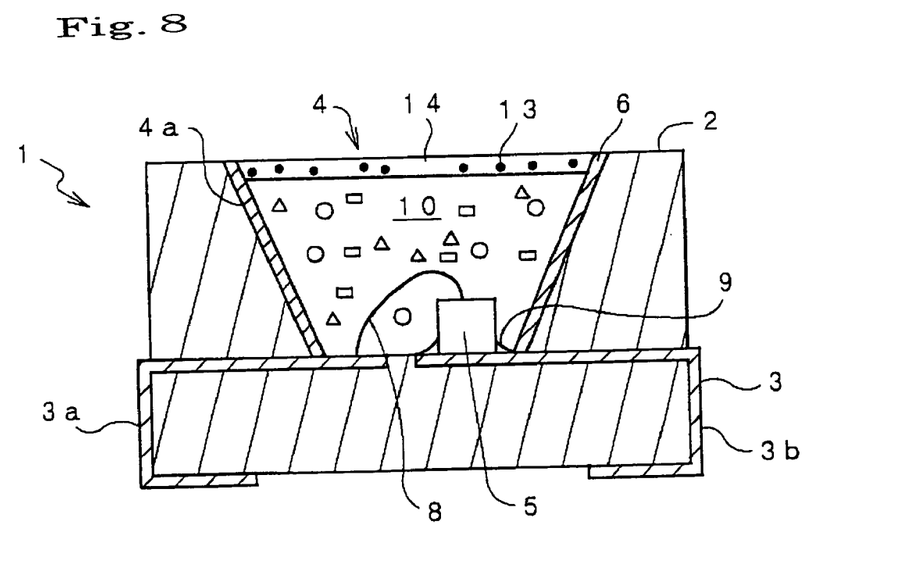
FIG. 8 is a sectional view of a variation of the LED device of FIG. 1.

In stead of molding the mixture of the translucent resin 10 and the mirror surface particles 13 in the recess 4, as shown in FIG. 8, a reflection resin layer 14 comprising the mixture of the translucent resin 10 and the mirror surface particles 13 may be disposed on the opening of the recess 4 separately to form a double mold structure. Alternatively, a sheet-like reflection resin layer 14 may be glued to the surface layer of the emitting surface or the recess 10 of the device 1.

In addition, as a still another variation of the above embodiment, any dye may be mixed in the translucent resin 10 to suppress an apparent luminance in an initial state. After using the LED device 1 for a long time, the LED chip 5 is deteriorated and its energy output is reduced, though simultaneously the dye is decolorized, allowing the transmittance of the translucent resin 10 to be improved. As a result, even long time used, apparent decline of the luminance of the LED device 1 can be prevented, providing a long lifetime device.

Figure 9:
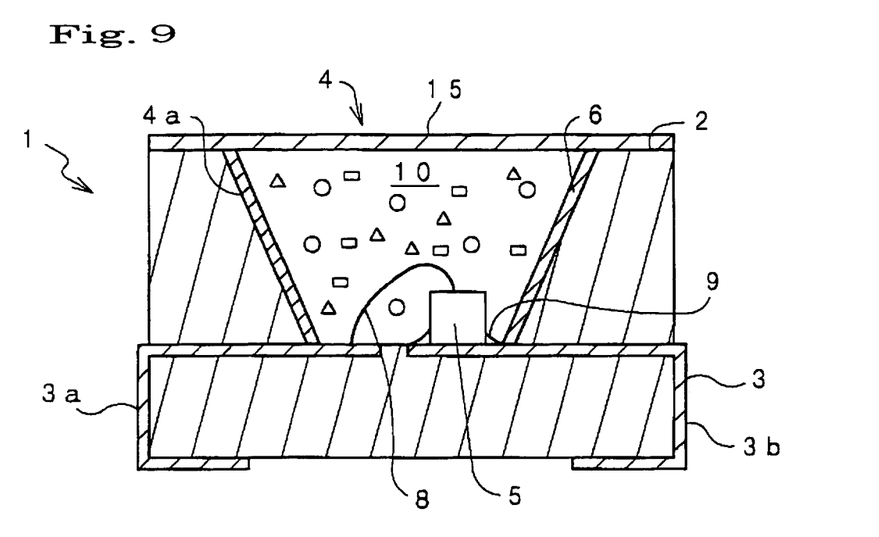
FIG. 9 is a sectional view of a variation of the LED device of FIG. 1.

As shown in FIG. 9, an ultraviolet cut filter or ultraviolet reflection member 15 for cutting ultraviolet light having a wavelength of 400 nm or below may be provided on the emitting surface or the opening of the recess 4 of the LED device 1. Thus, the influence of the light having a wavelength of 430 nm or below or the light within a region of ultraviolet wavelength emitted from the LED chip 5 upon a user can be reduced, ensuring eye safety.

On the emitting surface of the LED device 1 may be provided a phosphor thin layer (not shown) including any one of the phosphors 7, 7b, 7c of red, green, blue. The emitting wavelength of the LED device 1 may be monitored and the surface of the phosphor thin layer provided on the emitting layer may be trimmed using a laser trimming method so that a desired wavelength can be obtained. When the emitting wavelength of the LED device 1 is amended to the desired wavelength, a single color tone for all LED devices 1 can be obtained, which reduces the variation in the color tone of the lights emitted from the LED devices 1.

In the above variation of the embodiment, the base 2 is made of metal material, though a heat pipe (not shown) may be disposed inside the base 2. Thus, the thermal resistance of the LED device 1 can be reduced and the LED chip 5 can be driven under a large current, increasing the luminance of the LED device 1.

As shown in FIG. 10, A protrusion 2a protruding from the center portion of the bottom of the base 2 may be formed and may be fit into a mounting substrate 16 (substrate for heat sink such as Al substrate) on which the LED device 1 is to be mounted. Thus, the heat generated from the LED chip 5 can be released to the mounting substrate 16 (outside) through the protrusion 2a of the base 2, which reduces the thermal resistance and increases the drive current of the LED chip, resulting in increase of the light intensity of the LED device 1. Furthermore, the protrusion 2a of the base 2 is designed to be positioned at the lower position than the lower portion of the metal frame 3.

Figure 11:
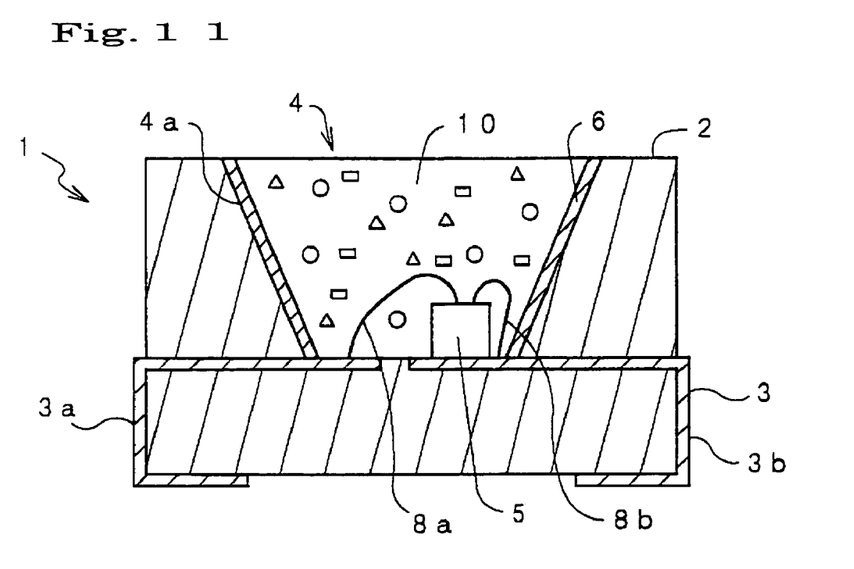
FIG. 11 is a sectional view of a variation of the LED device of FIG. 1.
Figure 12:
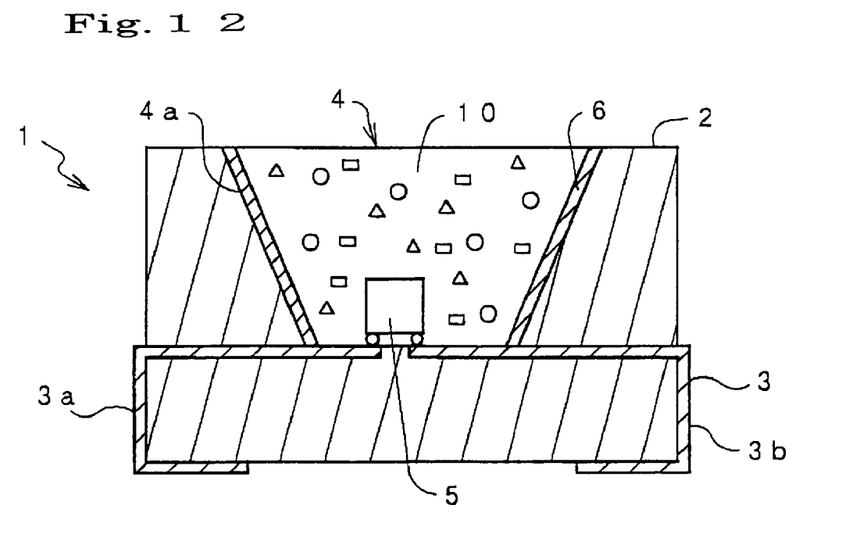
FIG. 12 is a sectional view of a variation of the LED device of FIG. 1.

The method of electric connection between the LED chip 5 and the terminal electrodes 3a, 3b is not limited to the above embodiments. For example, as shown in FIG. 11, wire bonding may be conducted between the terminal electrodes 3a, 3b of the metal frame 3 and the LED chip 5 using Au wires 8a, 8b to accomplish the electric connection. Also, as shown in FIG. 12, bump connection may be conducted between the terminal electrodes 3a, 3b of the metal frame 3 and the LED chip 5 by means of a facedown process to accomplish the electric connection.

Figure 13:
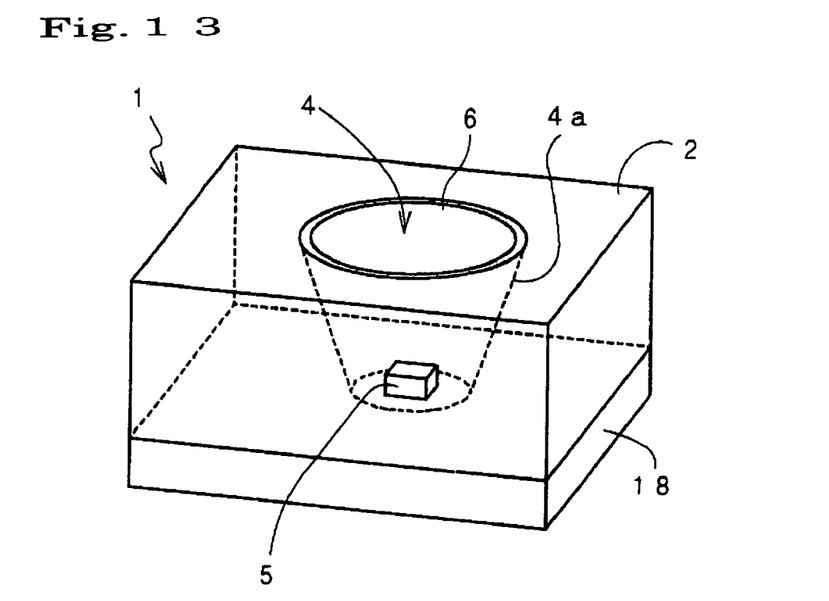
FIG. 13 is a perspective view of a variation of the LED device of FIG. 1.

In the above embodiments, the mounting portion of the LED chip 5 is comprised of the insert molding (base 2) of molding resin and the metal frame 3. However, in stead of metal frame 3, as shown in FIG. 13, it may be allowable to provide a substrate 18 made of glass epoxy material, ceramic material and so on and integrally form the base 2 on the substrate 18. It may be also allowable to form the base 2 by gluing plates of glass epoxy material.

As will be clear from the above description, the LED device according to the present invention comprises a base having a mortar-like recess with the upper surface opened, the inner wall surface of the recess constituting a reflection surface; a LED chip disposed on the inner bottom of the recess; a resin filled in the recess, the resin including phosphors which absorb a part of light emitted from the LED chip to convert the wavelength thereof and emit light; and a phosphor layer formed on the reflection surface, the phosphor layer including the phosphors. Thus, the present invention has an effect that the phosphors included in the phosphor layer effectively convert the light from the LED chip, enhancing reflection efficiency and luminance.

The present invention also has an effect that even if the emitting wavelength of the LED chip is 430 nm and below, it is possible to prevent increase of the transmittance in the reflection surface and decrease of the light reflection efficiency.

Although the present invention has been fully described by way of the examples with reference to the accompanying drawing, it is to be noted that various changes and modifications will be apparent to those skilled in the art. Therefore, unless such changes and modifications otherwise depart from the spirit and scope of the present invention, they should be construed as being included therein.

What is claimed is:

1. A LED device, comprising:
   a base having a recess with the upper surface opened, the inner wall surface of the recess constituting a reflection surface;
   a LED chip disposed on the inner bottom of the recess;
   a resin filled in the recess, the resin including phosphors which absorb a part of light emitted from the LED chip to convert the wavelength thereof and emit light; and
   a phosphor layer formed on the reflection surface, the phosphor layer including the phosphors, wherein the phosphor layer comprises a plurality of phosphor layers each of which is excited to emit a different wavelength of light from each other.

2. A LED device as claimed in claim 1, wherein the emitting wavelength of the LED chip is 430 nm or below.

3. A LED device as claimed in claim 1, wherein the plurality of phosphor layers are so arranged that the phosphor layer closer to the outside emits the shorter wavelength of light.

4. A LED device as claimed in claim 1, wherein the phosphor layer is formed by a method selected from the group consisting of vacuum depositing, printing and ink-jet applying.

5. A LED device as claimed in claim 1, wherein the phosphors are enclosed by micro-capsules each comprising Si as a main component.

6. A LED device as claimed in claim 1, wherein the base is made of glass or metal material.

7. A LED device as claimed in claim 1, wherein the phosphor layer is overlaid on a metal plating applied on the reflection surface.

8. A LED device as claimed in claim 7, wherein the metal plating is applied by means of a composite plating method in which electrodeposition is conducted as the phosphors are dispersed in the plating liquid of the metal plating.

9. A LED device as claimed in claim 1 further comprising mirror surface particles each having a mirror surface, the mirror surface particles being dispersed in the surface layer of the resin filled in the recess at the rate of 10% or below of the surface area.

10. A LED device, comprising:
- a base having a recess with the upper surface opened, the inner wall surface of the recess constituting a reflection surface;
- a LED chip disposed on the inner bottom of the recess;
- a resin filled in the recess, the resin including phosphors which absorb a part of light emitted from the LED chip to convert the wavelength thereof and emit light;
- an ultraviolet rays reflecting material applied on the reflection surface; and
- mirror surface particles each having a mirror surface, the mirror surface particles being dispersed in the surface layer of the resin filled in the recess at the rate of 10% or below of the surface area.

11. A LED device as claimed in claim 1 or 10, wherein the LED device further comprises a reflection resin layer disposed on the opening of the recess separately from the resin, the reflection resin layer being formed on or glued to the resin, the reflection resin layer including mirror surface particles each having a mirror surface.

12. A LED device as claimed in claim 1 or 10, wherein dyes are mixed in the resin.

13. A LED device as claimed in claim 1 or 10, wherein the LED device is provided with an ultraviolet cut filter or ultraviolet reflection member for cutting ultraviolet light having a wavelength of 400 nm or below on the opening of the recess.

14. A LED device as claimed in claim 1 or 10, wherein the LED device is provided with a phosphor thin layer including the phosphors on the opening of the recess, the surface of the phosphor thin layer being trimmed using a laser trimming method.

15. A LED device as claimed in claim 1 or 10, wherein a heat pipe may be disposed inside the base.

16. A LED device as claimed in claim 1 or 10, wherein the center portion of the bottom of the base is protruded below.

* * * * *